(12) United States Patent
Li et al.

(10) Patent No.: US 7,470,625 B2
(45) Date of Patent: *Dec. 30, 2008

(54) METHOD OF PLASMA ETCHING A SUBSTRATE

(75) Inventors: Li Li, Meridian, ID (US); Bradley J. Howard, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 249 days.

This patent is subject to a terminal disclaimer.

(21) Appl. No.: 11/418,256

(22) Filed: May 5, 2006

(65) Prior Publication Data

US 2006/0252198 A1 Nov. 9, 2006

Related U.S. Application Data

(60) Continuation of application No. 10/969,568, filed on Oct. 21, 2004, now Pat. No. 7,122,480, which is a continuation of application No. 09/902,691, filed on Jul. 12, 2001, now abandoned, which is a division of application No. 09/292,393, filed on Apr. 15, 1999, now Pat. No. 6,335,292.

(51) Int. Cl.
 H01L 21/302 (2006.01)
 H01L 21/461 (2006.01)

(52) U.S. Cl. .................. 438/706; 438/710; 438/714; 438/717; 438/723; 438/725

(58) Field of Classification Search .......... 438/710, 438/714, 717, 723, 725
See application file for complete search history.

(56) References Cited

U.S. PATENT DOCUMENTS

| | | | |
|---|---|---|---|
| 4,554,048 A | 11/1985 | Manocha | |
| 4,908,095 A | 3/1990 | Kagatsume et al. | |
| 4,920,070 A | 4/1990 | Mukai | |
| 5,008,212 A | 4/1991 | Chen | |
| 5,021,121 A | 6/1991 | Groechel et al. | |
| 5,102,815 A | 4/1992 | Sanchez | |
| 5,242,532 A | 9/1993 | Cain | |
| 5,242,536 A | 9/1993 | Schoenborn | |
| 5,312,717 A | 5/1994 | Sachdev et al. | |
| 5,441,596 A | 8/1995 | Nutly | |
| 5,451,290 A | 9/1995 | Salfelder | |
| 5,474,648 A | 12/1995 | Patrick et al. | |
| 5,612,574 A | 3/1997 | Summerfelt et al. | |
| 5,662,770 A | 9/1997 | Donohoe | |
| 5,710,067 A | 1/1998 | Foote et al. | |
| 5,726,499 A | 3/1998 | Irinoda | |
| 5,843,226 A | 12/1998 | Zhao et al. | |
| 5,843,266 A | 12/1998 | Greenwood | |

(Continued)

FOREIGN PATENT DOCUMENTS

JP 11040683 A 2/1999

*Primary Examiner*—Duy-Vu N Deo
(74) *Attorney, Agent, or Firm*—Dickstein Shapiro LLP

(57) ABSTRACT

A method for controlling striations and CD loss in a plasma etching method is disclosed. During the etching process, the substrate of semiconductor material to be etched is exposed first to plasma under a low power strike and subsequently to a conventional high power strike. CD loss has been found to be reduced by about 400 Angstroms and striations formed in the contact holes are reduced.

14 Claims, 6 Drawing Sheets

U.S. PATENT DOCUMENTS

| | | | |
|---|---|---|---|
| 5,976,986 A * | 11/1999 | Naeem et al. | 438/714 |
| 5,998,302 A | 12/1999 | Fujisawa | |
| 5,998,868 A | 12/1999 | Pogge et al. | |
| 6,054,377 A | 4/2000 | Filipiak et al. | |
| 6,057,227 A | 5/2000 | Harvey | |
| 6,074,959 A | 6/2000 | Wang et al. | |
| 6,083,844 A | 7/2000 | Bui-Le et al. | |
| 6,159,794 A | 12/2000 | Yang et al. | |
| 6,162,696 A | 12/2000 | Cheng et al. | |
| 6,180,533 B1 | 1/2001 | Jain et al. | |
| 6,335,292 B1 * | 1/2002 | Li et al. | 438/714 |
| 6,355,557 B2 | 3/2002 | Stinnett et al. | |
| 6,426,016 B1 | 7/2002 | Yang et al. | |
| 6,489,632 B1 | 12/2002 | Yamazaki et al. | |
| 6,759,351 B2 * | 7/2004 | Boulenger | 438/725 |
| 7,119,025 B2 * | 10/2006 | Daley et al. | 438/725 |
| 7,122,480 B2 * | 10/2006 | Li et al. | 438/714 |

* cited by examiner

METHOD OF PLASMA ETCHING A SUBSTRATE

CROSS REFERENCE TO RELATED APPLICATIONS

This application is a continuation of U.S. patent application Ser. No. 10/969,568, filed Oct. 21, 2004, now U.S. Pat. No. 7,122,480 which is a continuation of U.S. patent application Ser. No. 09/902,691, filed Jul. 12, 2001, now abandoned which is a divisional of U.S. patent application Ser. No. 09/292,393, filed Apr. 15, 1999 (U.S. Pat. No. 6,335,292), the entire disclosures of which are hereby incorporated by reference.

FIELD OF THE INVENTION

The present invention relates to the fabrication of integrated circuit devices and, in particular, to a method for controlling striations and CD loss in the integrated circuit during an etching process.

BACKGROUND OF THE INVENTION

Semiconductor integrated circuits are typically fabricated on a wafer or substrate of a semiconductor material such as, for example, silicon or gallium arsenide. During the fabrication, the wafer is subjected to a sequence of steps, which may include photomasking, material deposition, oxidation, nitridization, ion implantation, diffusion, and etching, among others.

Etching may be achieved by wet etching processes or dry etching processes. Dry etch processes, such as a plasma etch or ion-assisted etch, are known for etching materials for semiconductor fabrication in silicon integrated circuit technology. Plasma etches are largely anisotropic or unidirectional. Plasma etches may be used to create spaces or substantially vertical sidewalls in the integrated circuit layers, to transfer a mask pattern to an underlying layer with little or no undercutting beneath mask segment edges and to create contact paths in insulative layers. Plasma etch processes are especially useful for producing sub-quarter micrometer patterns and geometries.

Semiconductor integrated circuits with high device density require the patterning of closely spaced submicrometer lines in semiconductors materials to form submicron geometries such as small area emitters for bipolar transistors, short gates for field effect transistors and narrow interconnection lines between devices. The formation of such polysilicon, metal or insulator structures typically requires definition of the locations of such structures in a layer of photoresist on a layer of polysilicon or insulator by exposure of the photoresist with light passing through a reticle or photomask containing the desired pattern. After exposure and treatment of the photoresist, the underlying layer of the substrate is plasma etched using the patterned photoresist as a template. The masking material protects designated areas of the substrate from the etch process. Subsequent processing steps are determined according to the type of device to be fabricated.

As advances in photolithographic and processing capabilities progressively increase, the lateral dimensions of features in silicon integrated circuits continue to decrease. Fabrication of reduced device geometries in integrated circuits mandates minute contact holes of submicron size on insulation layers and minimum isolation distance requirements measured in terms of critical dimensions (CD). For example, recent generations of complementary metal-oxide silicon integrated circuits (CMOS) have gate regions with dimensions on the order of 0.25 microns, or even 0.18 microns and less in the near future.

As the integrated circuit manufacture goes to the sub-quarter regime, a challenge to the high aspect ratio is that the deep ultraviolet (DUV) resist needed to pattern the integrated circuit is thinner and more malleable than prior photoresists. Large striations and uncontrolled increases in the size of the contact holes, known as CD losses, are common during the photolithographic process in the sub-quarter micron regime.

During photolithography, problems arise because high resolution submicrometer images in photoresist require shallow depth of focus during exposure, but thick photoresist patterns are required because of the poor etch rate between the photoresist and the underlying semiconductor layer. Additional problems occur because of the uncontrolled bake during the plasma etch processing. During this process, the substrate is exposed to ion and electron bombardment, UV light, X-rays, and scattered radiations. As a consequence, irregular topographies, distorted images and CD loss occurs during the exposure of the photoresist layer as shown in FIGS. 1-2. These figures illustrate a typical plasma etch of a silicon substrate 40 having an oxide layer 42 deposited thereon. Contact holes 12, 14, 16 are etched into wafer 10. The contact holes 12, 14, 16 have an upper surface 38 and a lower surface 36. Due, in part, to the thin DUV resist and the uncontrolled bake during the etching process, discontinuities 18, 20, 22, 24, 26, 28, 30 and 46 are formed as shown for contact hole 12. The discontinuities 18, 20, 22, 24, 26, 28, 30, 46 occur in the contact hole 12 as a result of the plasma etch attacking the side walls of the contact hole 12. It should be understood that the shape and number of the discontinuities will vary depending upon the specific etching process parameters as well as the material which is being etched. The discontinuities may form which have a first surface 32 and a second surface 34 in the wall 44 of the contact hole 12. In addition, contact holes 12, 14, 16 are formed in a frusto-conical shape instead of a cylindrical shape when formed in the oxide layer 42.

When two discontinuities 22, 46 are formed in adjacent contact holes 12, 14 and become aligned with one another, the integrated circuit suffers a loss in critical dimension (CD loss). CD loss is a critical component of integrated circuit design, especially in the sub-quarter micron regime. Additionally, when the contact holes 12, 14, 16 are formed in a frusto-conical shape instead of the desired cylindrical shape, surface area is sacrificed thereby requiring the contact holes 12, 14, 16 to be deeper to effectuate the same contact.

A further problem with the prior plasma etching is that as a result of the irregular contact holes 12, 14, 16 an unwanted and uncontrolled increase in the diameter of the contact holes 12, 14, 16 may also result. This increased size also impacts the displacement of the metal atoms that fill the contact holes. Thus, in addition to the loss in critical dimension, electrical contacts may also become unreliable.

Several attempts have been made to solve this problem. It has been suggested that the distorted images can be alleviated by employing a three-layer photoresist technique such as in U.S. Pat. No. 5,242,532 (Cain) or by employing a silylation layer process such as in U.S. Pat. No. 5,312,717 (Sachdev et al.). These solutions, however, require additional time consuming and costly steps in the etching process.

Accordingly, there is a need for improved plasma etching that provides a substantially uniform etch without a reduction in the critical dimension and without striations formed in the sidewalls of the etched portion of the substrate. The improved plasma etching technique should provide a substrate having increased uniformity across the substrate surface, a substantially uniform trench, a substantially uniform profile angle and a smooth sidewall.

SUMMARY OF THE INVENTION

The present invention provides a plasma etching process that reduces the striations and the CD loss between two contact holes in a substrate. The present invention provides an etching process in which the substrate of semiconductor material to be etched is formed with a substantially uniform etch without a reduction in the critical dimension and without striations formed in the sidewalls. The method of the present invention includes exposing a substrate to be etched to a first plasma under low-power, preferably at about radio frequency (RF) 150 W and then subsequently contacting the substrate to a conventional high power etch, preferably at about RF 950 W. Additional advantages of the present invention will be apparent from the detailed description and drawings, which illustrate preferred embodiments of the invention.

DETAILED DESCRIPTION OF THE PREFERRED EMBODIMENTS

Figure 1:
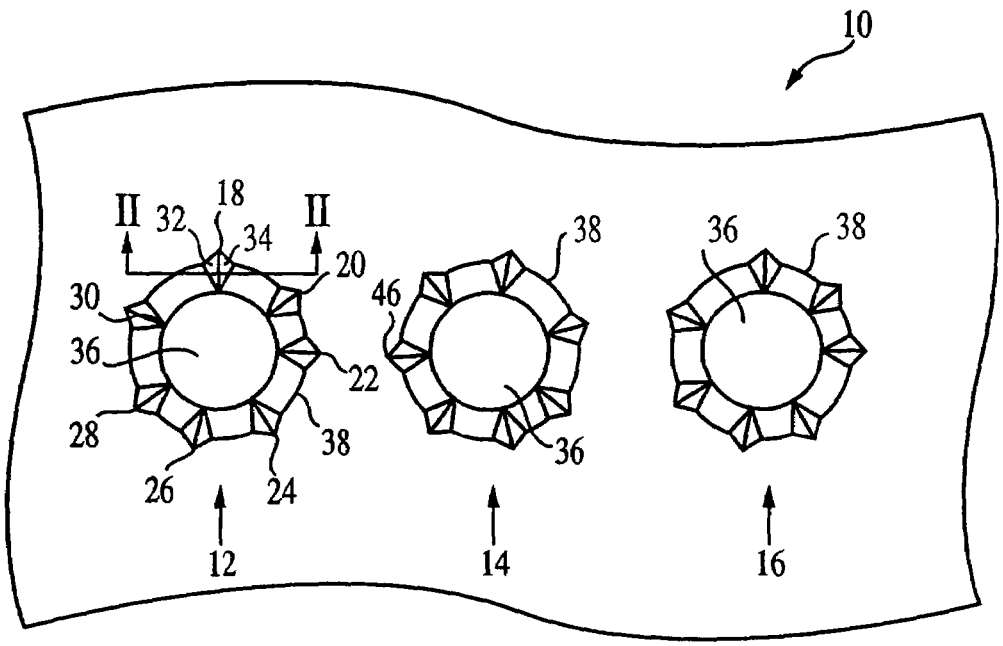
FIG. 1 is a top view of a semiconductor having three contact holes etched therein according to a method the present invention overcomes.
Figure 2:
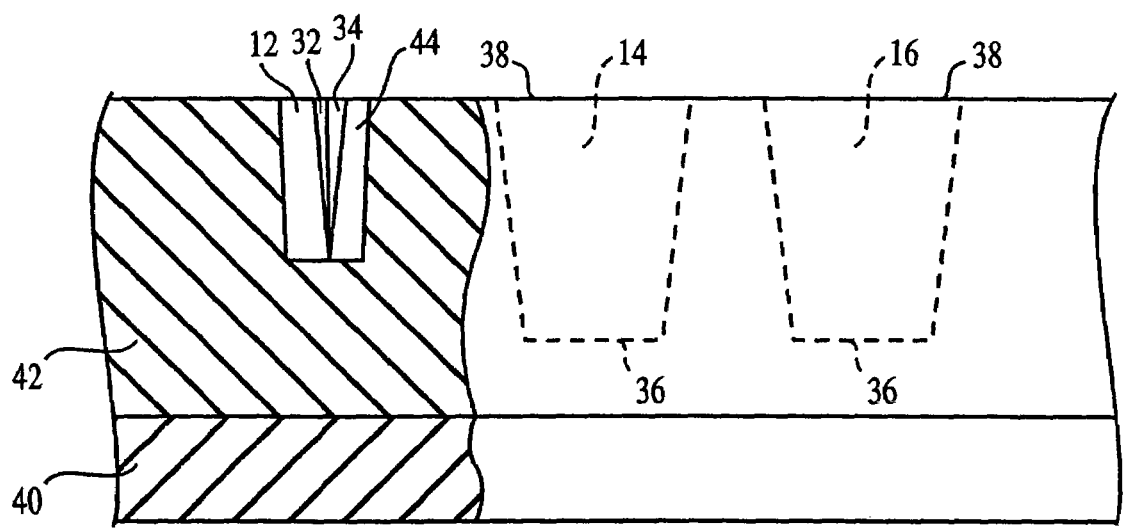
FIG. 2 is a partial cross-sectional view taken along line II-II of FIG. 1.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions in the base semiconductor or foundation. The following detailed description may not be taken, therefore, in a limiting sense, and the scope of the present invention is defined by the appended claims.

The present invention relates to a method for plasma etching a semiconductor substrate which includes adding a low power strike step before the main plasma etching. The method reduces striations formed in the substrate and decreases the CD loss. As discussed in more detail below, the present invention is an improved plasma etching process in a high-density-source plasma reactor, i.e., one which uses a remote source to generate a plasma and which also uses a high-frequency bias power on the substrate. During the low power strike, it is believed that the photoresist lateral erosion is slowed while the resist is cured by UV radiation from the low power plasma. This additional step has been shown to decreases the CD loss by about 400 Angstroms and also reduce the striations in the etched semiconductor substrate.

Plasma etch systems are mainly vacuum chambers in which a glow discharge produces a plasma consisting of chemically reactive species such as atoms, radicals, and ions from a relatively inert molecular gas. These reactive species interact either kinetically or chemically with the material to be etched. The plasma etching gas may be any gaseous material known for etching. Examples of suitable plasma etching gases are those such as HBr, Cl, fluorocarbon containing gases and the like. It should be understood that the selection of the plasma etching gas will be determined by the substrate to the etched as well as the physical parameters of the etching process such as power, pressure, temperature and the like. Examples of some preferred gases for use with the present invention include: HBr, $Cl_2$ carbon tetrafluoride ($CF_4$) trifluoromethane (CHF3) and the like. The etching gas may be used alone or in combination with other etching gases and may also be used in conjunction with an inert gas, such as argon or helium, to dilute the etching gases and to enhance the uniformity of the surface being etched.

The etching process of the present invention is carried out in a high density plasma (HDP) reactor such as an enhanced reactive ion etch. A reactive ion etch is a combination of chemical plasma etching, in which a plasma etches by chemically reacting with the substrate, and ion beam etching, which is a physical process using high energy ions to bombard the substrate in order to etch it. An explanation of plasma etching techniques may be found in U.S. Pat. No. 5,662,770 and U.S. Pat. No. 5,843,226 which are herein incorporated by reference.

Figure 3:
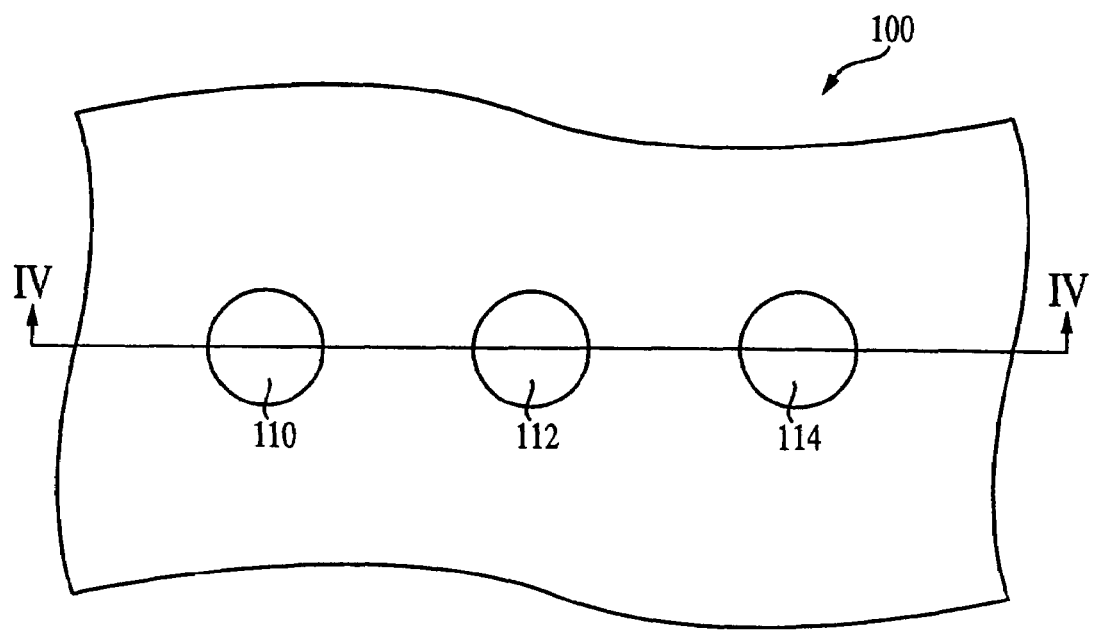
FIG. 3 is a top view of a semiconductor having three contact holes etched therein according to the present invention.
Figure 4:
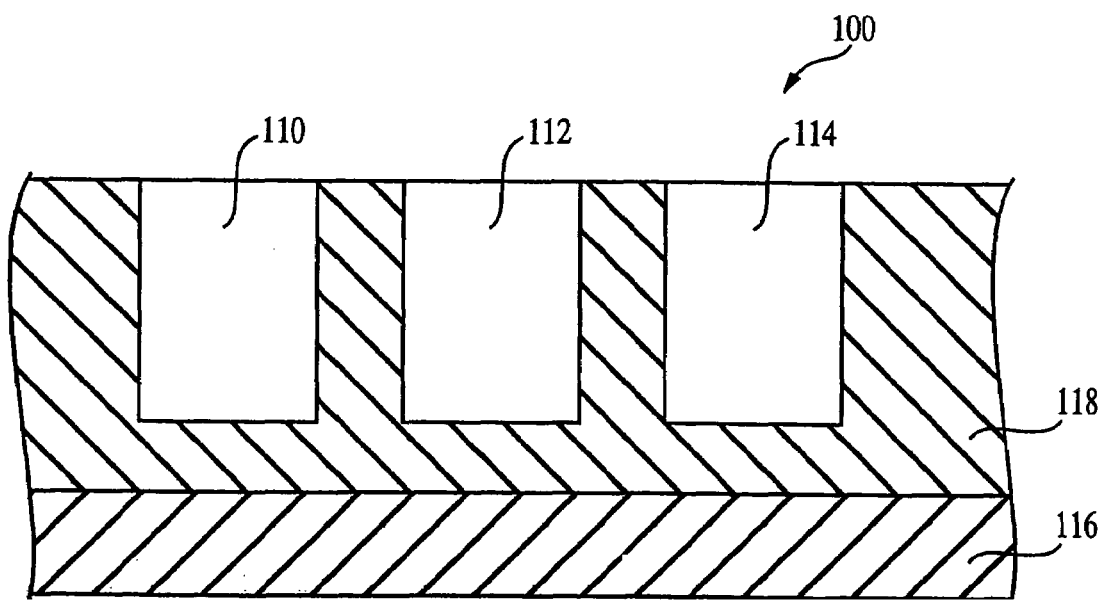
FIG. 4 is a cross-sectional view taken along the line IV-IV of FIG. 3.

Referring now to the drawings, where like elements are designated by like reference numerals. A representative substrate etched according to the present invention is illustrated in FIGS. 3-4. These figures show a wafer 100 formed of a substrate 116 having an oxide layer 118 which has cylindrical contact holes 110, 112, 114 formed therein by the method of the present invention as described in more detail below. The contact holes 110, 112, 114 have a uniform shape and the critical dimension between the contact holes 110, 112, 114 is maintained.

Figure 5:
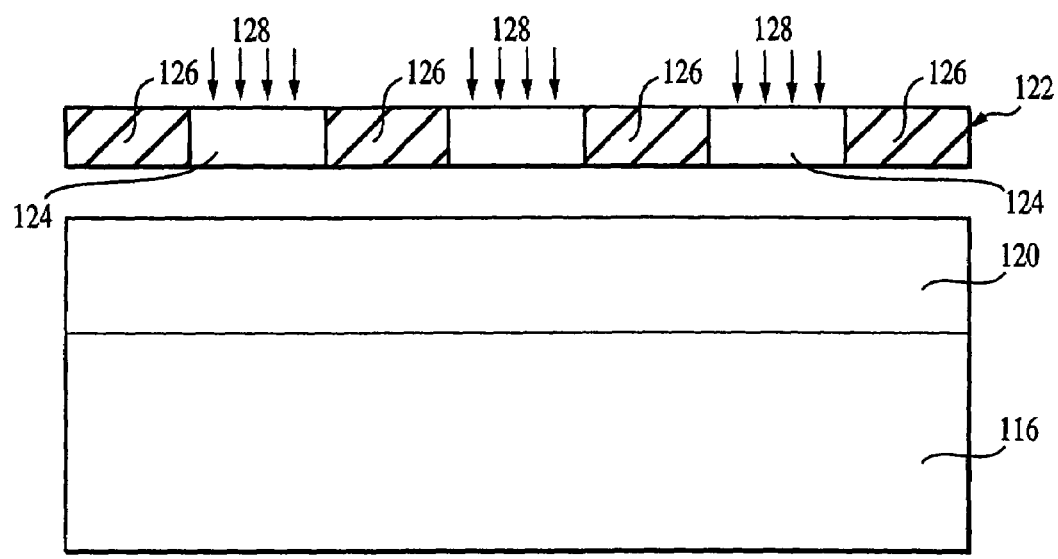
FIG. 5 a diagrammatic cross-sectional view of a semiconductor wafer according to the present invention at an intermediate stage of processing.
Figure 6:
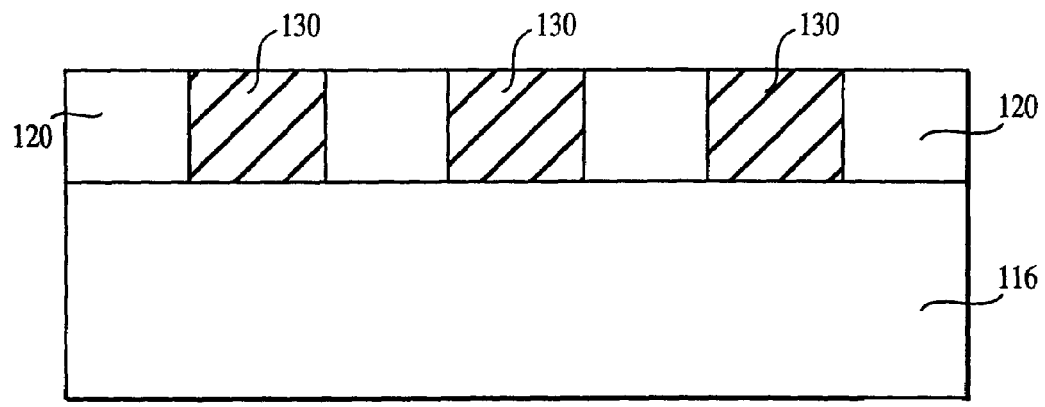
FIG. 6 is a diagrammatic cross-sectional view of a semiconductor wafer according to the present invention subsequent to that shown in FIG. 5.

Reference is now made to FIG. 5. A photoresist layer 120 is applied over a substrate 100. A UV mask 122 is placed over the photoresist layer 120. The mask 122 has areas 124 which allow UV light 128 to pass through and contact the photoresist layer 120. The mask also includes areas 126 which block the UV light 128 from contacting the photoresist layer 120. The UV light 128 contacts the photoresist layer 120 and develops the photoresist layer 120 under regions 124 of the UV mask 122 leaving developed photoresist areas 130 as shown in FIG. 6.

Figure 7:
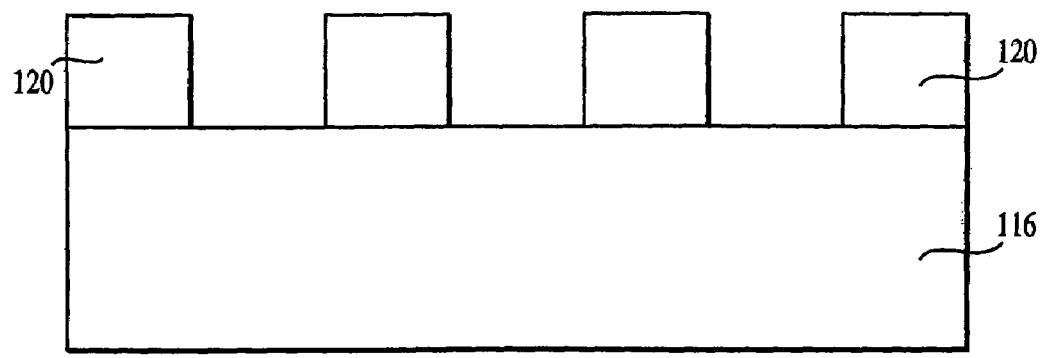
FIG. 7 is a diagrammatic cross-sectional view of a semiconductor wafer according to the present invention subsequent to that shown in FIG. 6.

The UV light causes the exposed photoresist 130 to undergo chemical changes and become more acidic. After pattern generation, the exposed (acidic) photoresist layer 130 is removed with a base solution leaving the structure as shown in FIG. 7. Since the photoresist layer 120 is substantially resistant to etching, certain portions of the substrate 116 covered by the photoresist patterns 120 are substantially not etched during the etching of the substrate. The substrate is then placed in a plasma reactor. The substrate is contacted with a low power plasma and the lateral erosion of the photoresist layer 120 is slowed while the photoresist layer 120 is cured by UV radiation from the low power plasma. The substrate is contacted with the low power plasma in the plasma reactor for about 3 to about 10 seconds, preferably for about 5 seconds.

The plasma etching gas may be any gaseous material known for etching. Examples of suitable plasma etching gases are those such as HBr, Cl, fluorocarbon containing gases and the like. It should be understood that the selection of the plasma etching gas will be determined by the substrate to be etched as well as the physical parameters of the etching process such as power, pressure, temperature and the like. Examples of some preferred gases for use with the present invention include: HBr, $Cl_2$ carbon tetrafluoride ($CF_4$) trifluoromethane (CHF3) and the like. The low power plasma is formed at low power, such as, for example, 100 to about 250 watts (RF), preferebly about 150 watts.

According to a preferred embodiment, the plasma etching process uses a process gas that comprises a mixture of two fluorocarbons, preferably carbon tetrafluoride ($CF_4$) and trifluoromethane (CHF3). The etching gas mixture flows into the reactor at a rate of approximately 50 standard cubic centimeters per minute (sccm) to form a plasma (glow discharge) over the substrate. A diluent gas such as argon also flows into the reactor at approximately 80 sccm. The preferred pressure in the etch chamber is about 120 mTorr, and the preferred cathode temperature is about 20 degree(s) C.

Figure 8:
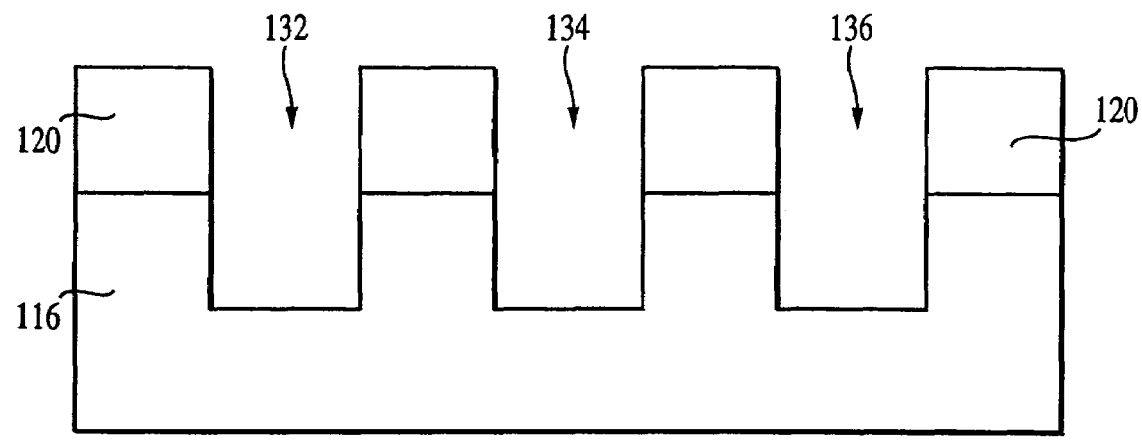
FIG. 8 is a diagrammatic cross-sectional view of a semiconductor wafer according to the present invention subsequent to that shown in FIG. 7.
Figure 9:
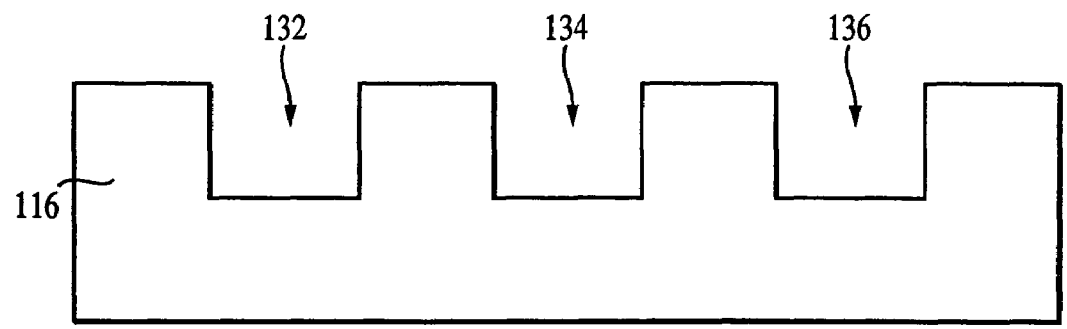
FIG. 9 is a diagrammatic cross-sectional view of a semiconductor wafer according to the present invention subsequent to that shown in FIG. 8.

Reference is now made to FIG. 8. The substrate 116 is then etched out by a directional etching process such as reactive ion etching. Etching is continued down to the level of the substrate to form a set of trenches 132, 134, 136. The plasma etching is carried out under ordinary high power etching conditions. The plasma etch may be formed at a power of from about 800 to about 1100 watts (RF), preferably at from about 950 watts. Any suitable etching gas may be used in accordance with the present invention. Preferably, the same etching gases used in the low power plasma etching step are used in the high power plasma etching. In fact, it is an advantage of the present invention that the plasma etching parameters, such as gas composition, reactor pressure and the like do not need to be modified. This allows the present invention to efficiently etch the substrate 116 without the need for additional time consuming processing steps. The substrate can be contacted with the high power etch for any time sufficient to etch the underlying substrate. It should be understood that these times may vary from about 30 seconds to over 500 seconds, depending upon the substrate, the etching gas and the physical parameters of the plasma etch. The additional photoresist 120 is then removed from the substrate 116 to arrive at the device shown in FIG. 9.

As the etching process goes to the sub-quarter regime, the photoresist layer 120 must be robust enough to withstand reactive ion etching. However, due to enhanced ion bombardment near the trench 132, 134, 136 corners, the photoresist layer 120 becomes thinner and softer and it looses its resistance to chemical etching when exposed to UV light. The present invention cures the photoresist layer 120 with a low power plasma etch step reducing the lateral erosion of the photoresist layer 120. This additional low power strike eliminates striation in the trench walls and has been found to reduce CD loss by 400 angstroms.

The invention is further explained with reference to the following example. This invention is not intended to be limited by the particular example described below. The Example is also described with reference to FIGS. 10-15. As a preferred embodiment, a combination of the following set of initial etch parameters in the first four steps of the plasma etching process may be used.

Figure 10:
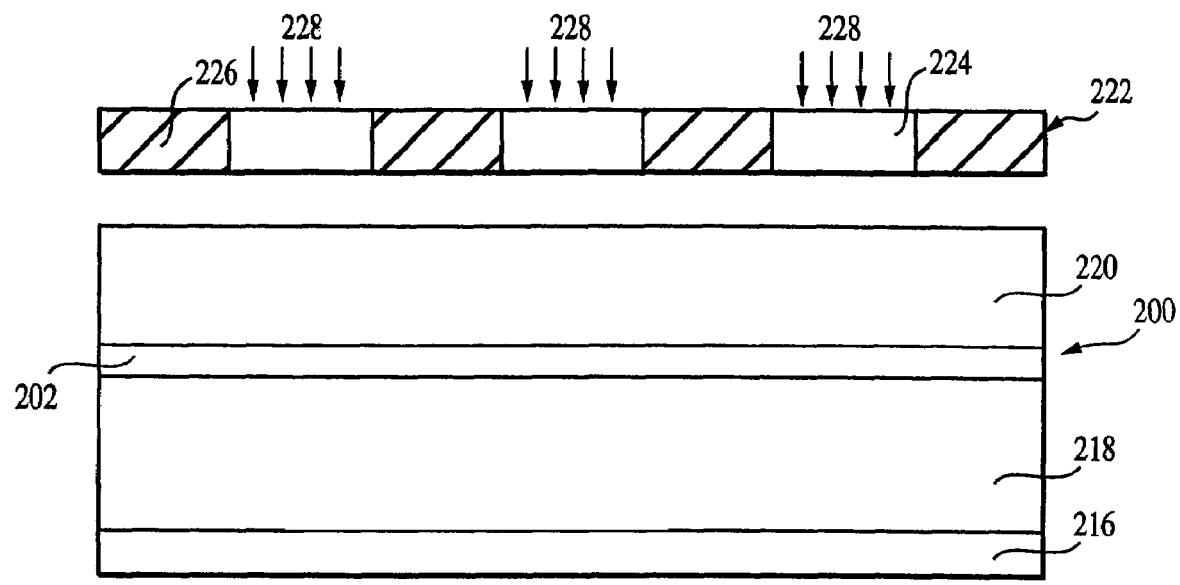
FIG. 10 a diagrammatic cross-sectional view of a semiconductor wafer according to a second embodiment of the present invention at an intermediate stage of processing.
Figure 11:
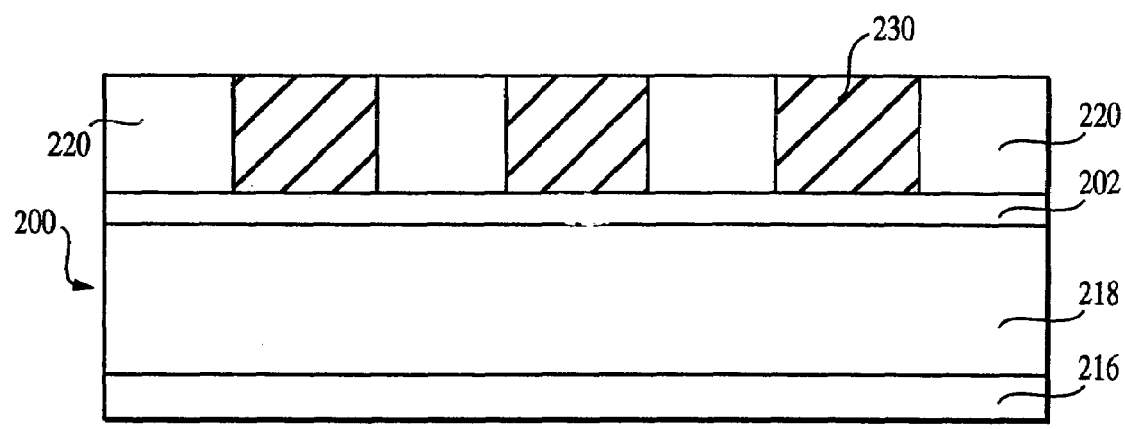
FIG. 11 is a diagrammatic cross-sectional view of a semiconductor wafer according to the present invention subsequent to that shown in FIG. 10.
Figure 12:
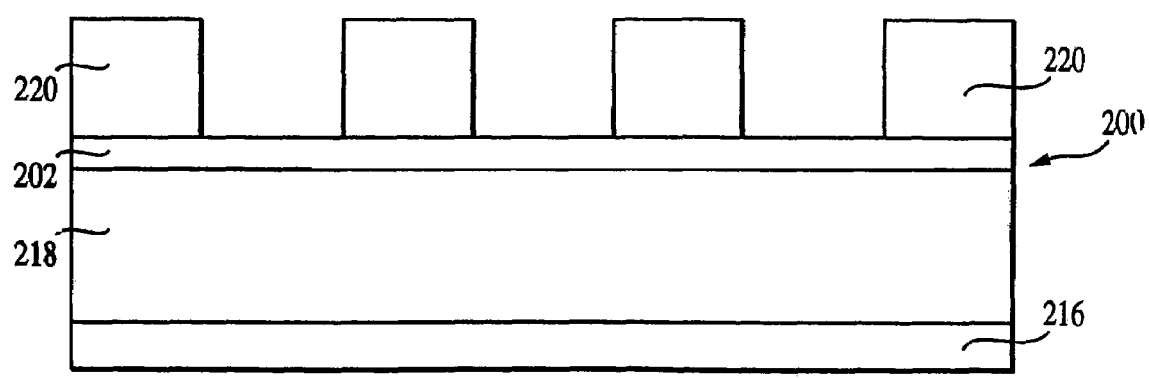
FIG. 12 is a diagrammatic cross-sectional view of a semiconductor wafer according to the present invention subsequent to that shown in FIG. 11.

Reference is made to FIG. 10. A wafer 200 including a substrate 216 having formed thereon an oxide layer 218 and a bottom antireflective coating (BARC) layer 202. A photoresist layer 220 is applied over a substrate 200. A UV mask 222 is placed over the photoresist layer 220. The mask 222 has areas 224 which allow UV light 228 to pass through and contact the photoresist layer 220. The mask also includes areas 226 which block the UV light 228 from contacting the photoresist layer 220. The UV light 228 contacts the photoresist layer 220 and develops the photoresist layer 220 under regions 224 of the UV mask 222 leaving developed photoresist areas 230 as shown in FIG. 11. After pattern generation, the exposed (acidic) photoresist layer 230 is removed with a base solution leaving the structure as shown in FIG. 12.

The substrate 200 is then placed in a plasma reactor and allowed to stabilize at the following conditions for about 10 seconds:

| Pressure: | | 120 | mTorr |
|---|---|---|---|
| RF Power: | | 0 | Watts |
| Magnetic Field: | | 0 | Gauss |
| Cathode Temperature: | | 20 | Celsius |
| Gas flows: | $CF_4$ | 50 | sccm |
| | $CHF_3$ | 50 | sccm |
| | Ar | 80 | sccm |

The substrate 200 is then contacted with a low power plasma under the following conditions for about 5 seconds:

| | | |
|---|---|---|
| Pressure: | | 120 mTorr |
| RF Power: | | 150 Watts, AUTO |
| Magnetic Field: | | 0 Gauss |
| Cathode Temperature: | | 20 Celsius |
| Gas flows: | CF$_4$ | 50 sccm |
| | CHF$_3$ | 50 sccm |
| | Ar | 80 sccm |

Figure 13:
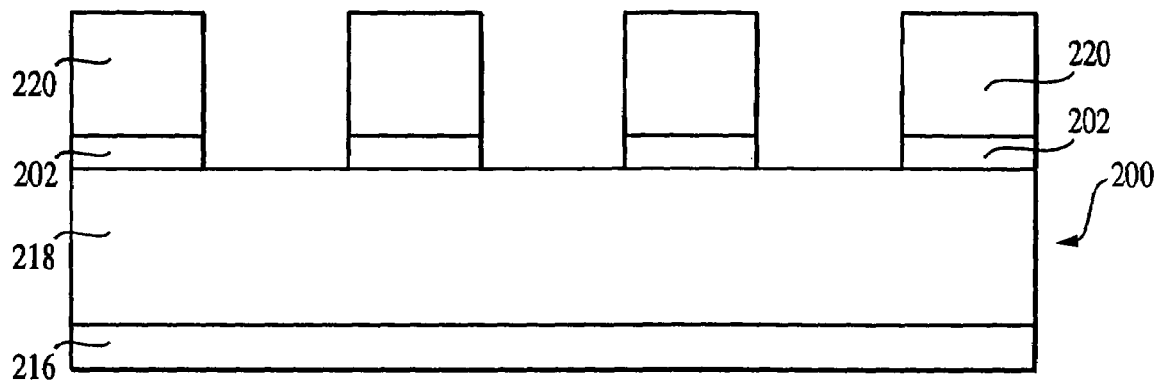
FIG. 13 is a diagrammatic cross-sectional view of a semiconductor wafer according to the present invention subsequent to that shown in FIG. 12.

Reference is now made to FIG. 13. After the low power plasma etch, BARC layer 202 is plasma etched under the following conditions for about 60 seconds:

| | | |
|---|---|---|
| Pressure: | | 120 mTorr |
| RF Power: | | 950 Watts, AUTO |
| Magnetic Field: | | 0 Gauss |
| Cathode Temperature: | | 20 Celsius |
| Gas flows: | CF$_4$ | 50 sccm |
| | CHF$_3$ | 50 sccm |
| | Ar | 80 sccm |

Figure 14:
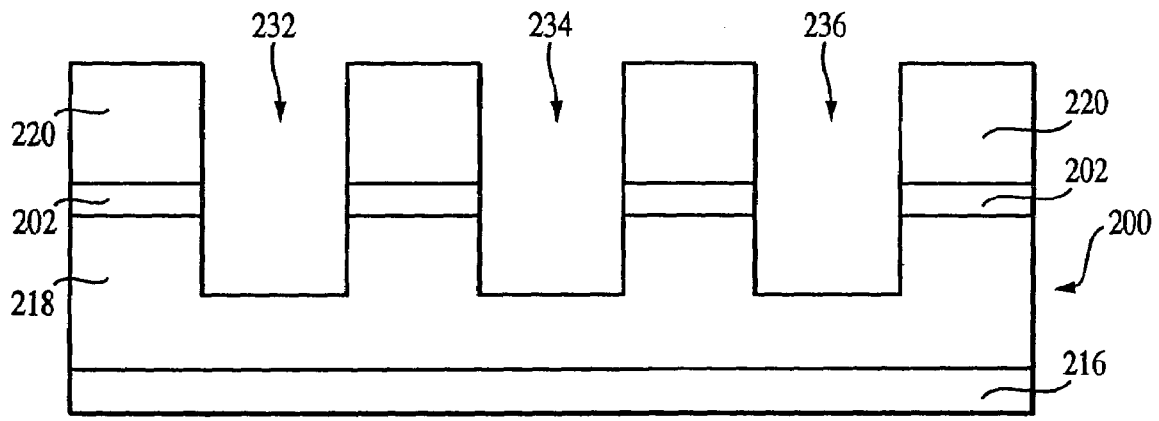
FIG. 14 is a diagrammatic cross-sectional view of a semiconductor wafer according to the present invention subsequent to that shown in FIG. 13.

Reference is now made to FIG. 14. After the BARC etch, oxide layer 218 is etched in an oxide main etch step to form trenches 232, 234 and 236. The oxide layer 218 is plasma etched under the following conditions for about 280 seconds:

| | | |
|---|---|---|
| Pressure: | | 120 mTorr |
| RF Power: | | 950 Watts, AUTO |
| Magnetic Field: | | 0 Gauss |
| Cathode Temperature: | | 20 Celsius |
| Gas flows: | CF$_4$ | 15 sccm |
| | CHF$_3$ | 80 sccm |
| | Ar | 140 sccm |

Figure 15:
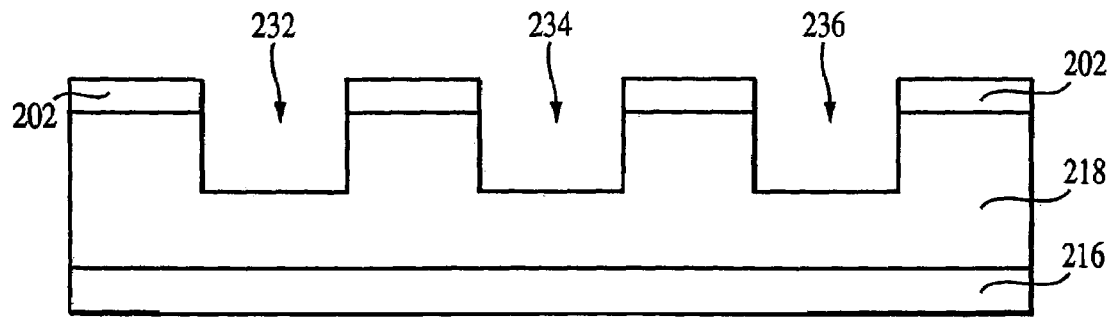
FIG. 15 is a diagrammatic cross-sectional view of a semiconductor wafer according to the present invention subsequent to that shown in FIG. 14.

The photoresist layer 220 is removed with subsequent processing and the resultant substrate 200 is illustrated in FIG. 15. By adding a low power strike before the BARC etch, the striations in the substrate 200 are significantly reduced, and the CD loss is reduced by about 400 Angstroms compared to a similar process without the low power plasma etch.

The above description illustrates preferred embodiments which achieve the objects, features and advantages of the present invention. It is not intended that the present invention be limited to the illustrated embodiments. Any modification of the present invention that comes within the spirit and scope of the following claims should be considered part of the present invention.

The invention claimed is:

1. A method for plasma etching a silicon substrate, comprising:

providing a silicon substrate having an oxide layer, an antireflective coating, and at least one patterned photoresist element formed over the silicon substrate;

placing said substrate into a reactive chamber;

generating a low power plasma of an etching gas in said chamber at about 100-200 Watts;

contacting said at least one patterned photoresist element with said low power plasma to stabilize said at least one patterned photoresist element;

generating a first high power plasma of an etching gas in said chamber at about 800-1100 Watts;

contacting exposed portions of said antireflective coating exposed through said patterned photoresist element with said first high power plasma of said etching gas;

generating a second high power plasma of an etching gas in said chamber; and contacting said oxide layer with said second high power plasma of said etching gas.

2. The method according to claim 1, wherein said low power plasma is about 150 Watts.

3. The method according to claim 2, wherein said first and second high power plasma is about 950 Watts.

4. The method according to claim 1, wherein said step of generating a first low power plasma of an etching gas comprises introducing a mixture of etching gasses into the chamber at a pre-determined rate.

5. The method according to claim 4, wherein the mixture of gasses comprises CF4, CHF3 and Ar.

6. The method according to claim 4, wherein the pre-determined rate is approximately 50 standard cubic cm per minute (sccm).

7. The method according to claim 1, wherein the first and second high power plasma of said etching gas includes CF4, CHF3 and Ar.

8. The method according to claim 1, wherein said step of generating a low power plasma of an etching gas comprises a mixture of gases having respective flow rates forming a first set of flow rates.

9. The method according to claim 8, wherein said step of generating a first high power plasma of said etching gas comprising a mixture of gases having said first set of flow rates.

10. The method according to claim 9, wherein a second said high power plasma of said etching gas comprising said mixture of gases having respective flow rates forming a second set of flow rates which is different from said first set of flow rates.

11. The method according to claim 1, wherein the step of generating a low power plasma of an etching gas is performed under a pressure of 120 mTorr.

12. The method according to claim 11, wherein the step of contacting said at least one patterned photoresist element with said low power plasma of an etching gas is performed for about 5 seconds.

13. The method according to claim 1, wherein the step of contacting said antireflective coating with said first high power plasma of an etching gas is performed for about 60 seconds.

14. The method according to claim 13, wherein the step of contacting said oxide layer with said second high power plasma of an etching gas is performed for about 280 seconds.

* * * * *

UNITED STATES PATENT AND TRADEMARK OFFICE
CERTIFICATE OF CORRECTION

| | |
|---|---|
| PATENT NO. | : 7,470,625 B2 |
| APPLICATION NO. | : 11/418256 |
| DATED | : December 30, 2008 |
| INVENTOR(S) | : Li et al. |

It is certified that error appears in the above-identified patent and that said Letters Patent is hereby corrected as shown below:

In column 8, line 51, in Claim 13, delete "antiretlective" and insert -- antireflective --, therefor.

Signed and Sealed this

Twenty-fourth Day of March, 2009

JOHN DOLL
*Acting Director of the United States Patent and Trademark Office*